US012677644B2

(12) United States Patent
Wen et al.

(10) Patent No.: US 12,677,644 B2
(45) Date of Patent: Jul. 7, 2026

(54) ISOLATION STRUCTURE OF SEMICONDUCTOR DEVICE AND METHOD FOR FABRICATING THE SAME

(71) Applicant: UNITED MICROELECTRONICS CORP., Hsin-Chu City (TW)

(72) Inventors: Chih-Yuan Wen, Tainan City (TW); Lung-En Kuo, Tainan City (TW); Chung-Yi Chiu, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 396 days.

(21) Appl. No.: 18/227,991

(22) Filed: Jul. 31, 2023

(65) Prior Publication Data
US 2025/0014941 A1 Jan. 9, 2025

(30) Foreign Application Priority Data

Jul. 4, 2023 (TW) ................................. 112124896

(51) Int. Cl.
*H10W 10/17* (2026.01)
*H10W 10/00* (2026.01)
(52) U.S. Cl.
CPC ....... *H10W 10/17* (2026.01); *H10W 10/0143* (2026.01)

(58) Field of Classification Search
CPC ............. H10W 10/17; H10W 10/0143; H10W 10/014; H01L 21/76229; H01L 21/76224
See application file for complete search history.

(56) References Cited

U.S. PATENT DOCUMENTS

| | | | |
|---|---|---|---|
| 7,501,674 B2 | 3/2009 | Lee et al. | |
| 2010/0283108 A1* | 11/2010 | Sawada ............. | H01L 21/02337 257/E27.06 |
| 2011/0260294 A1* | 10/2011 | Oh .................... | H01L 21/76229 438/424 |
| 2016/0064234 A1* | 3/2016 | Lin ..................... | H10D 84/038 438/427 |
| 2023/0069612 A1* | 3/2023 | Hou .................. | H01L 21/76229 |

* cited by examiner

*Primary Examiner* — Julia Slutsker
(74) *Attorney, Agent, or Firm* — Winston Hsu

(57) ABSTRACT

An isolation structure of a semiconductor device includes a substrate, a first isolation structure and a second isolation structure. The substrate has a first region and a second region, and there is a boundary between the first region and the second region. The first isolation structure is disposed in the first region of the substrate, and the first isolation structure includes a dielectric liner and a first insulating layer. The second isolation structure is disposed in the second region of the substrate, and the second isolation structure includes a second insulating layer. The first isolation structure and the second isolation structure are respectively located on both sides of the boundary.

11 Claims, 5 Drawing Sheets

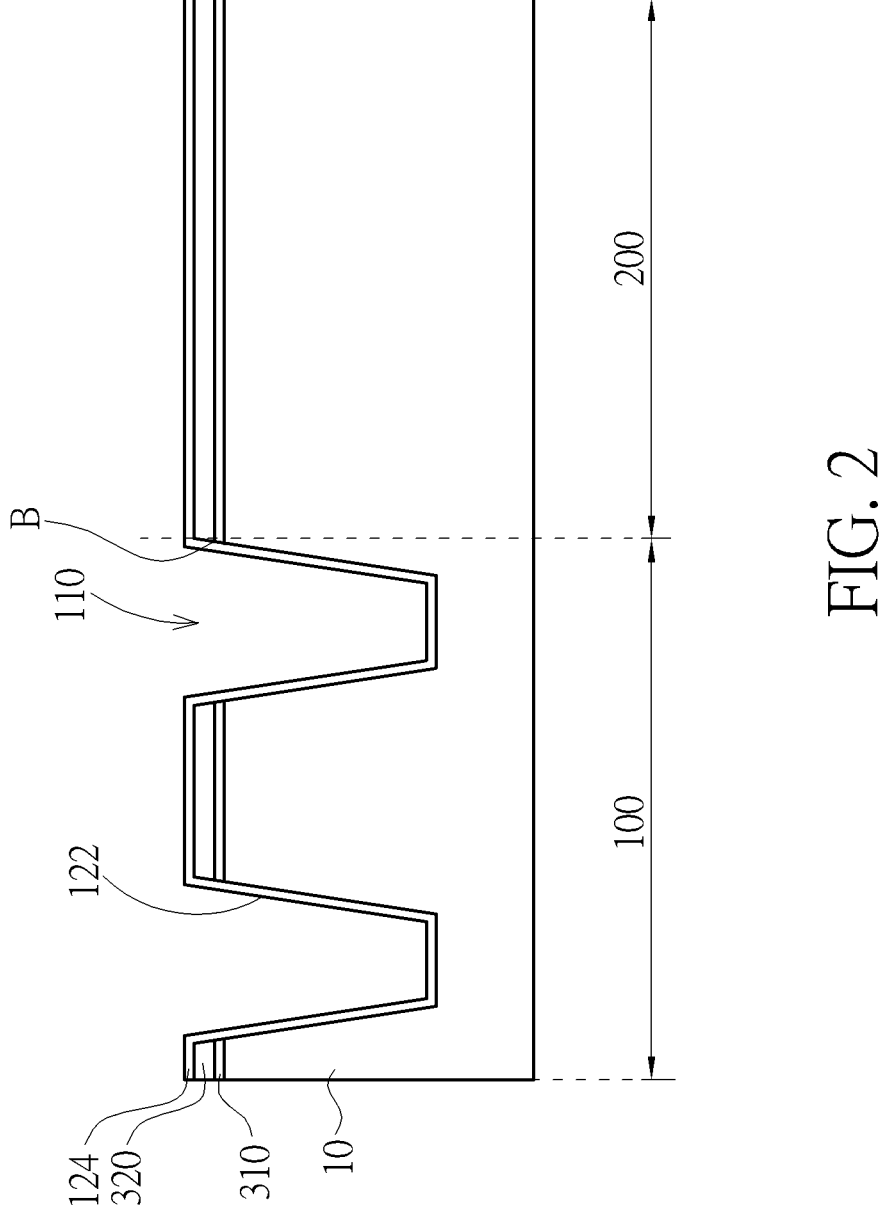
FIG. 2
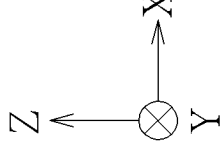

331

B

110

122

330

124

320

310

10

200

100

ISOLATION STRUCTURE OF SEMICONDUCTOR DEVICE AND METHOD FOR FABRICATING THE SAME

BACKGROUND OF THE INVENTION

1. Field of the Invention

The present disclosure relates to the field of semiconductor devices, and more particularly, to an isolation structure of a semiconductor device and a method for fabricating the same.

2. Description of the Prior Art

In advanced semiconductor technology, various devices having different dimensions may be integrally formed in a same chip for reducing production cost, enhancing performance and also achieving a lower power consumption to meet the needs of various products.

For example, a medium voltage device or a high voltage device usually is arranged with a larger dimension, and a low voltage device usually is arranged with a smaller dimension. However, when the semiconductor devices with different operation voltages and/or dimensions are fabricated in different regions of the same chip, some problems may occur at the boundary between the regions. For example, a boundary structure with a poor cross-sectional shape may be formed at the boundary between the regions. Therefore, the boundary structure is easy to break and cause pollution. Moreover, the sharp top of the boundary structure may generate point discharge. As a result, current leakage of the semiconductor device may be caused, or noises during product testing may be generated to interfere the test results.

SUMMARY OF THE INVENTION

According to one aspect of the present disclosure, an isolation structure of a semiconductor device includes a substrate, a first isolation structure and a second isolation structure. The substrate has a first region and a second region, and there is a boundary between the first region and the second region. The first isolation structure is disposed in the first region of the substrate, and the first isolation structure includes a dielectric liner and a first insulating layer. The second isolation structure is disposed in the second region of the substrate, and the second isolation structure includes a second insulating layer. The first isolation structure and the second isolation structure are located on both sides of the boundary, respectively.

According to another aspect of the present disclosure, a method for fabricating an isolation structure of a semiconductor device includes steps as follows. A substrate having a first region and a second region is provided, and there is a boundary between the first region and the second region. A first trench is formed in the first region of the substrate. A dielectric liner is formed in the first trench. A second trench is formed in the second region of the substrate, and the first trench and the second trench are located on both sides of the boundary, respectively. The first trench and the second trench are filled with an insulating material to form a first insulating layer in the first trench and a second insulating layer in the second trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1, FIG. 2, FIG. 3, FIG. 4 and FIG. 5 are schematic diagrams showing steps for fabricating an isolation structure of a semiconductor device according to one embodiment of the present disclosure.

DETAILED DESCRIPTION

In the following detailed description of the embodiments, reference is made to the accompanying drawings which form a part thereof, and in which is shown by way of illustration specific embodiments in which the disclosure may be practiced. In this regard, directional terminology, such as up, down, left, right, front, back, bottom or top is used with reference to the orientation of the Figure(s) being described. The elements of the present disclosure can be positioned in a number of different orientations. As such, the directional terminology is used for purposes of illustration and is in no way limiting. In addition, identical numeral references or similar numeral references are used for identical elements or similar elements in the following embodiments.

Hereinafter, for the description of "the first feature is formed on or above the second feature", it may refer that "the first feature is in contact with the second feature directly", or it may refer that "there is another feature between the first feature and the second feature", such that the first feature is not in contact with the second feature directly.

It is understood that, although the terms first, second, etc. may be used herein to describe various elements, regions, layers and/or sections, these elements, regions, layers and/or sections should not be limited by these terms. These terms may be only used to distinguish one element, region, layer and/or section from another element, region, layer and/or section. Terms such as "first," "second," and other numerical terms when used herein do not imply a sequence or order unless clearly indicated by the context. Thus, a first element, region, layer and/or section discussed below could be termed a second element, region, layer and/or section without departing from the teachings of the embodiments. The terms used in the claims may not be identical with the terms used in the specification, but may be used according to the order of the elements claimed in the claims.

According to one embodiment of the present disclosure, a method for fabricating an isolation structure of a semiconductor device includes steps as follows. A substrate having a first region and a second region is provided, and there is a boundary between the first region and the second region. A first trench is formed in the first region of the substrate. A dielectric liner is formed in the first trench. A second trench is formed in the second region of the substrate, and the first trench and the second trench are located on both sides of the boundary, respectively. The first trench and the second trench are filled with an insulating material to form a first insulating layer in the first trench and a second insulating layer in the second trench.

Figure 1:
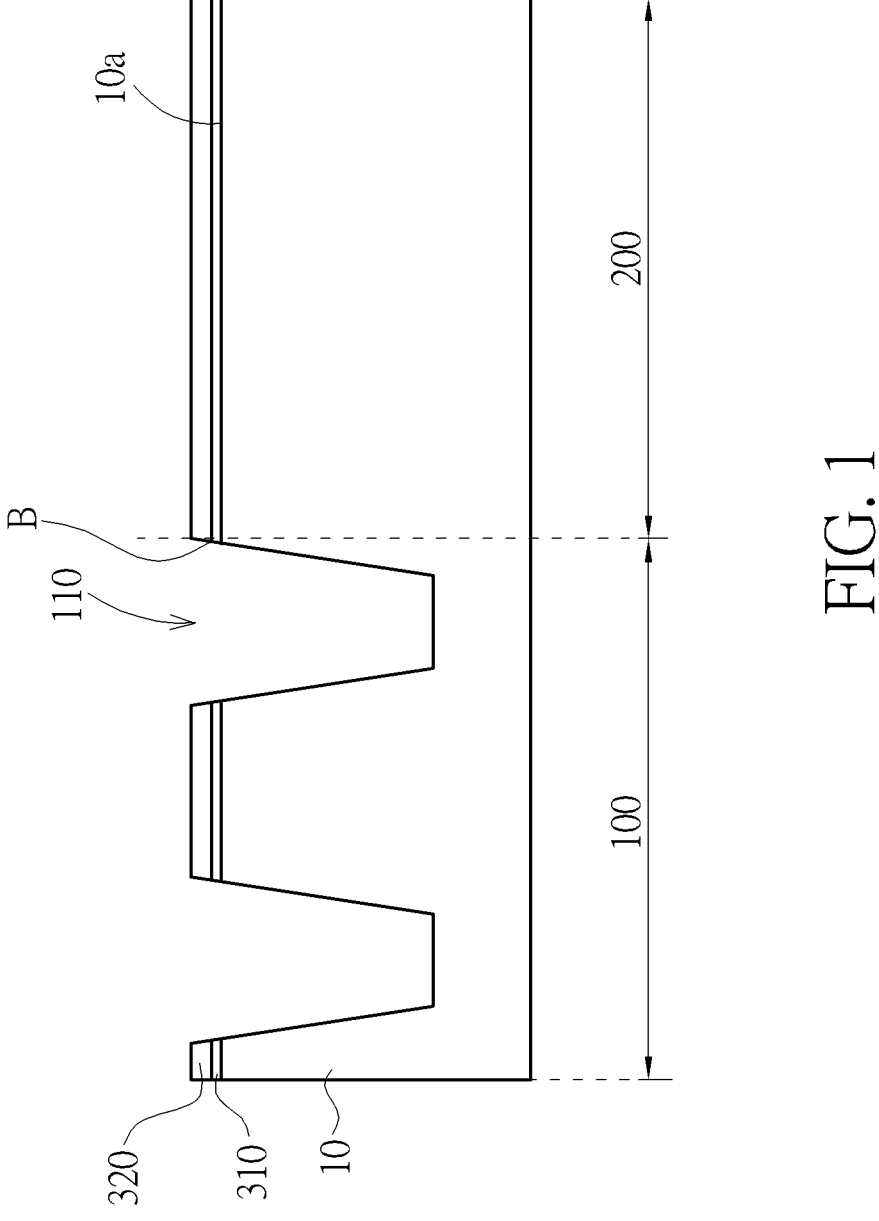
Figure 1:
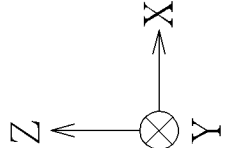

Please refer to FIG. 1 to FIG. 5, which are schematic diagrams showing steps for fabricating an isolation structure 1 of a semiconductor device according to one embodiment of the present disclosure, and are used to exemplarily illustrate the aforementioned method. In FIG. 1, a substrate 10 is provided. The substrate 10 has a first region 100 and a second region 200, and there is a boundary B between the first region 100 and the second region 200. The substrate 10 may be a silicon substrate, an epitaxial silicon substrate, a silicon carbide substrate or a silicon on insulator (SOI) substrate. The difference between the first region 100 and the second region 200 is that the first region 100 and the second region 200 are configured to dispose devices (not shown) with different operation voltages. The first region 100 can be, for example, a medium and high voltage device region and the second region 200 can be, for example, a low voltage device region. In general, taking a display chip as an example, the low voltage device region includes, for example, logic circuits, and an operation voltage thereof is less than or equal to 5 volts, and preferably within 1.5 volts. The operation voltage of the electronic devices disposed in the medium and high voltage device region is greater than 5 volts, and is usually greater than 10 volts. For example, a driving device of the display chip which requires a higher voltage to drive other devices is the medium voltage device or the high voltage device of the present disclosure. In other words, the operation voltage of the first region 100 can be greater than the operation voltage of the second region 200.

Next, a first hard mask 310 and a second hard mask 320 are sequentially formed on the substrate 10. The material of the first hard mask 310 may include an oxide such as silicon dioxide, and the material of the second hard mask 320 may include a nitride such as silicon nitride, but not limited thereto. Next, first trenches 110 are formed in the first region 100 of the substrate 10. For example, the first hard mask 310 and the second hard mask 320 of the first region 100 can be patterned by using processes such as a lithography process and an etching process, so that the first trenches 110 are formed in the first region 100.

Next, as shown in FIG. 2, a dielectric material 124 is fully covered on the substrate 10. Herein, a portion of the dielectric material 124 is disposed on the second hard mask 320, and a portion of the dielectric material 124 is disposed in the first trenches 110 as a dielectric liner 122. The dielectric material 124 may include an oxide or a nitride, the oxide may exemplary be silicon dioxide, and the nitride may exemplary be silicon nitride, but not limited thereto. In other words, the material of the dielectric liner 122 may include an oxide or a nitride.

Figure 3:
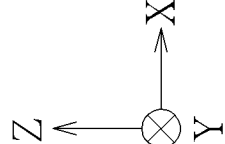
Figure 4:
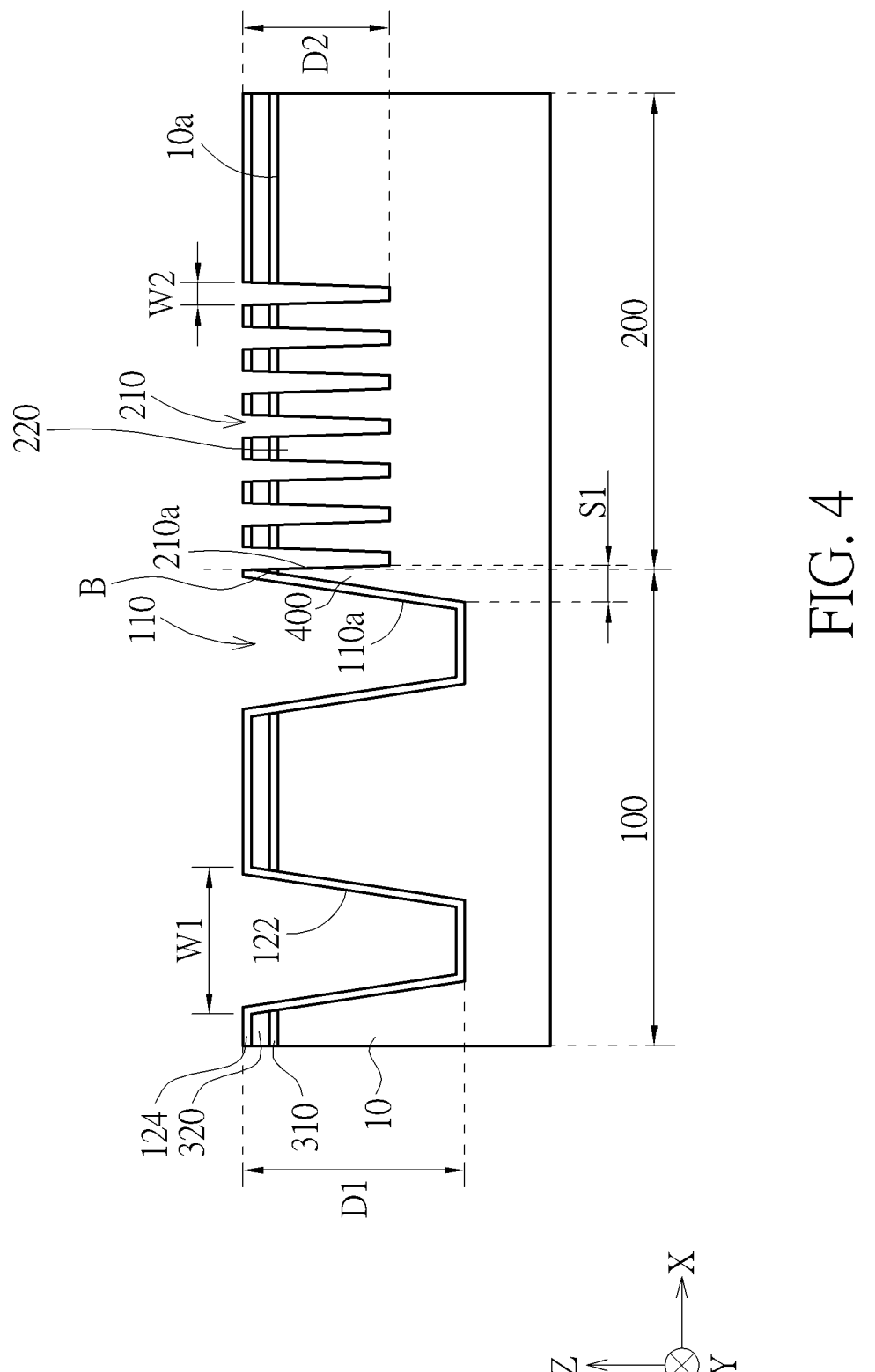

Next, as shown in FIG. 3, a patterned mask 330 is formed on the substrate 10, and the portion of the patterned mask 330 disposed on the second region 200 of the substrate 10 has a plurality of trenches 331. The material of the patterned mask 330 may include a photoresist, an oxide, a nitride or a combination thereof, such as silicon dioxide, silicon nitride or silicon oxynitride. The method for forming the patterned mask 330 may include pattern transfer such as a sidewall image transfer (SIT). Next, as shown in FIG. 4, the pattern of the patterned mask 330 can be transferred to the second region 200 of the substrate 10 through an etching process, so that a plurality of second trenches 210 and a plurality of fin structures 220 are formed in the second region 200 of the substrate 10, wherein the second trenches 210 surround the fin structures 220, the plurality of fin structures 220 are arranged to space apart from each other along a first direction (such as the direction X), and the fin structures 220 are arranged to extend along a second direction (such as the direction Y) perpendicular to the first direction. Next, the patterned mask 330 is removed. The fin structures 220 are arranged to extend along the second direction refers that a length of the fin structure 220 in the second direction is greater than a length of the fin structure 220 in the first direction.

As shown in FIG. 4, the first trench 110 and the second trench 210 are located on both sides of the boundary B, respectively. An inclined degree of a side surface 110a of the first trench 110 relative to a top surface 10a of the substrate 10 is less than an inclined degree of a side surface 210a of the second trench 210 relative to the top surface 10a of the substrate 10. Specifically, the top surface 10a of the substrate 10 extends along a horizontal direction (such as the direction X). The side surface 110a of the first trench 110 has a first slope relative to the horizontal direction. The side surface 210a of the second trench 210 has a second slope relative to the horizontal direction. The absolute value of the first slope is less than the absolute value of the second slope. A depth D1 of the first trench 110 is greater than a depth D2 of the second trench 210. A width W1 of the first trench 110 is greater than a width W2 of the second trench 210.

As shown in FIG. 4, when the fabrications of the first trench 110 and the second trench 210 are completed, a boundary structure 400 is defined between the first trench 110 and the second trench 210 directly adjacent to the boundary B. The boundary structure 400 has a triangular cross section, a top end (not otherwise labeled) of the boundary structure 400 has a sharp shape, and a top surface (not otherwise labeled) of the boundary structure 400 is aligned with a top surface (not otherwise labeled) of the region wherein the first trenches 110 and the second trenches 210 are not disposed. A left side surface of the boundary structure 400 (i.e., the side surface 110a of the first trench 110) and a right side surface of the boundary structure 400 (i.e., the side surface 210a of the second trench 210) are asymmetrical with each other and inclined degrees thereof are different. However, the present disclosure is not limited thereto. In other embodiments, the boundary structure 400 may have a quadrangular cross section with a width decreased gradually from bottom to top. According to one embodiment of the present disclosure, a distance S1 between the first trench 110 and the second trench 210 directly adjacent to the boundary B (i.e., the width (not otherwise labeled) of the boundary structure 400) may be less than or equal to 50 nanometers (nm). In other words, the width of the boundary structure 400 may be less than or equal to 50 nm. In the present disclosure, with forming the dielectric liner 122 in the first trench 110 after forming the first trench 110 in the first region 100 and before forming the second trench 210 in the second region 200, the left side surface of the boundary structure 400 (i.e., the side surface 110a of the first trench 110) is disposed with the dielectric liner 122, and the right side surface of the boundary structure 400 (i.e., the side surface 210a of the second trench 210) is not disposed with the dielectric liner 122. The dielectric liner 122 can protect the boundary structure 400, so as to improve the cross sectional shape of the boundary structure 400. Accordingly, it may reduce the pollution caused by the break of the boundary structure 400, and also reduce the probabilities of point discharge and noises during testing generated by the boundary structure 400.

Figure 5:
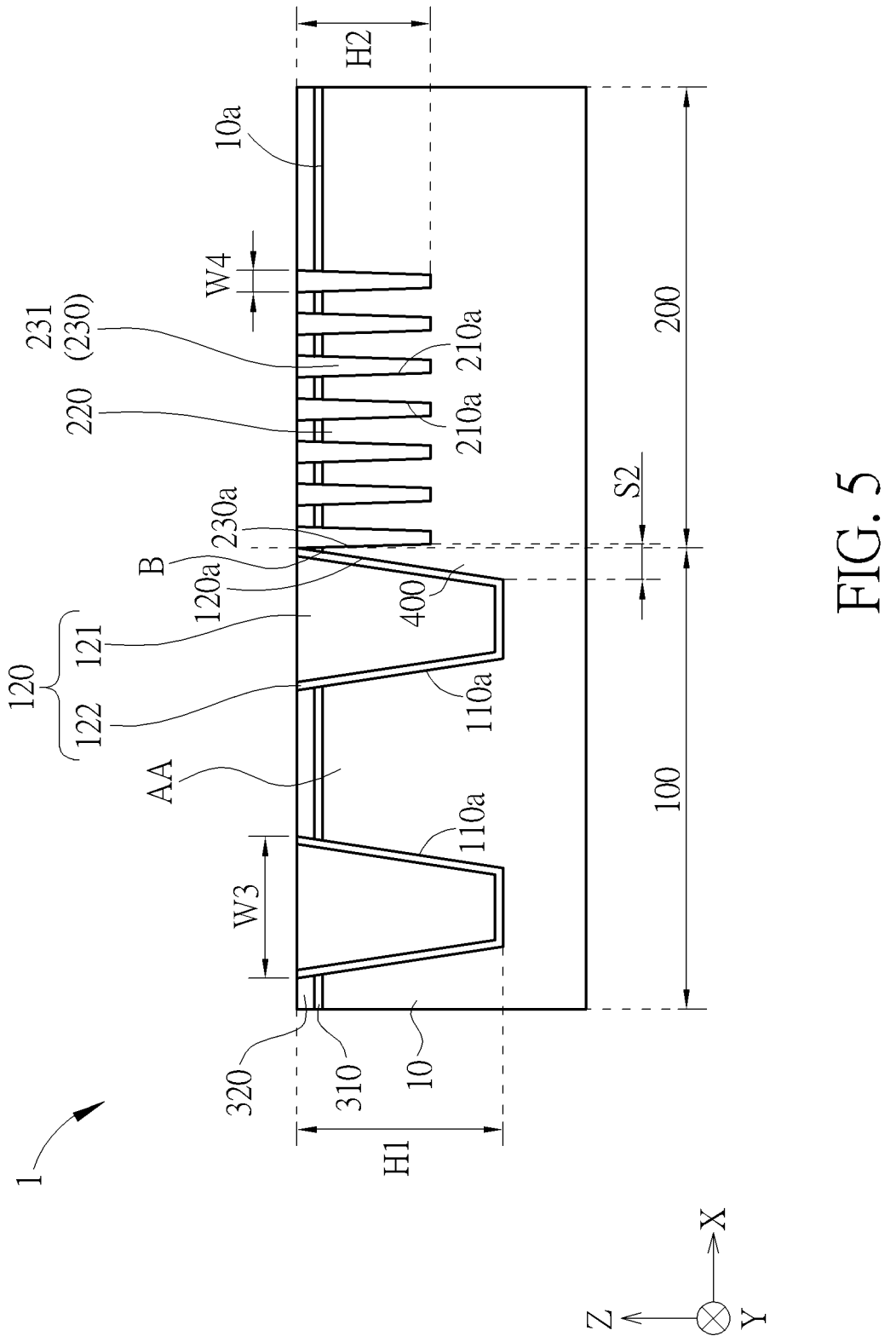

Next, as shown in FIG. 5, the first trench 110 and the second trench 210 can be simultaneously filled with an insulating material through processes, such as a deposition process and a planarization process, to form a first insulating layer 121 in the first trench 110 and a second insulating layer 231 in the second trench 210, and the dielectric material 124 on the second hard mask 320 is removed. Thereby, the fabrication of the isolation structure 1 of the semiconductor device is completed. The insulating material may include a dielectric material. For example, the dielectric material may be an oxide, such as silicon dioxide. In other words, the materials of the first insulating layer 121 and the second insulating layer 231 may include a dielectric material such as an oxide. The first insulating layer 121 and the second insulating layer 231 can be formed in an identical step. That is, the material of the first insulating layer 121 and the material of the second insulating layer 231 can be the same. Furthermore, the insulating material may be different from the material of the dielectric liner 122.

The aforementioned film layers, such as the first hard mask 310, the second hard mask 320, the dielectric material 124, the patterned mask 330, the first insulating layer 121 and the second insulating layer 231, may be formed by any suitable methods. For example, the methods may be, but are not limited to, molecular-beam epitaxy (MBE), chemical vapor deposition (CVD), metal organic chemical vapor deposition (MOCVD), hydride vapor phase epitaxy (HVPE) and atomic layer deposition (ALD).

FIG. 5 shows a schematic cross-sectional view of an isolation structure 1 of a semiconductor device according to one embodiment of the present disclosure. The isolation structure 1 of the semiconductor device includes a substrate 10, a first isolation structure 120 and a second isolation structure 230. The substrate 10 has a first region 100 and a second region 200, and there is a boundary B between the first region 100 and the second region 200. The first isolation structure 120 is disposed in the first region 100 of the substrate 10, and the first isolation structure 120 includes a dielectric liner 122 and a first insulating layer 121. The second isolation structure 230 is disposed in the second region 200 of the substrate 10, and the second isolation structure 230 includes a second insulating layer 231. The first isolation structure 120 and the second isolation structure 230 are located on both sides of the boundary B, respectively. The isolation structure 1 of the semiconductor device may further include a fin structure disposed in the second region 200, wherein the second isolation structure 230 surrounds the fin structure 220.

As shown in FIG. 5, there is a boundary structure 400 between the first isolation structure 120 and the second isolation structure 230 directly adjacent to the boundary B. A top surface (not otherwise labeled) of the boundary structure 400 is aligned with a top surface (not otherwise labeled) of the first isolation structure 120 and a top surface (not otherwise labeled) of the second isolation structure 230. For details of the boundary structure 400, reference may be made to the related description above, and are omitted herein. According to one embodiment of the present disclosure, a distance S2 between the first isolation structure 120 and the second isolation structure 230 directly adjacent to the boundary B is less than or equal to 50 nm. The distance S2 is equal to the distance S1 (see FIG. 4).

As shown in FIG. 5, an inclined degree of a side surface 120a of the first isolation structure 120 relative to a top surface 10a of the substrate 10 is less than an inclined degree of a side surface 230a of the second isolation structure 230 relative to the top surface 10a of the substrate 10. The inclined degree of the side surface 120a of the first isolation structure 120 and the inclined degree of the side surface 110a (see FIG. 4) of the first trench 110 are the same. The inclined degree of the side surface 230a of the second isolation structure 230 and the inclined degree of the side surface 210a (see FIG. 4) of the second trench 210 are the same. A height H1 of the first isolation structure 120 is greater than a height H2 of the second isolation structure 230. A ratio of the height H1 to the height H2 can be 1.60 to 1.86. The height H1 can be 2400 nm to 2600 nm, and the height H2 can be 1400 nm to 1500 nm. According to one embodiment of the present disclosure, the height H1 is 2500 nm, and the height H2 is 1450 nm. A width W3 of the first isolation structure 120 is greater than a width W4 of the second isolation structure 230. A ratio of the width W3 to the width W4 can be 4 to 10. The width W3 can be 160 nm to 200 nm, and the width W4 can be 10 nm to 40 nm. According to one embodiment of the present disclosure, the width W3 is 180 nm, and the width W4 is 20 nm. In FIG. 5, a normal direction (such as the direction Z) can be defined by the top surface 10a of the substrate 10, the widths W3 of the first isolation structure 120 vary along the normal direction, and the widths W4 of the second isolation structure 230 vary along the normal direction. The aforementioned range and the values of the width W3 and the width W4 refer to the range and the values of the maximum width W3 and the maximum width W4.

The first isolation structure 120 is used to define the region AA for disposing a medium voltage device (not shown) or a high voltage device (not shown) to be formed later. Because the operation voltage of the medium voltage device or the high voltage device is higher, the first isolation structure 120 needs to be configured with a larger dimension (height H1 and width W3) to achieve a better isolation effect. The operation voltage of the low voltage device (not shown) formed later in the second region 200 is lower, so that the dimension (height H2 and width W4) of the second isolation structure 230 is less than that of the first isolation structure 120, and the disposition density of the second isolation structure 230 is greater than that of the first isolation structure 120. A left side surface (i.e., the side surface 110a of the left first trench 110) and the right side surface (i.e., the side surface 110a of the right first trench 110) of the region AA are substantially symmetrical and both have the dielectric liner 122 disposed thereon. The left side surface of the boundary structure 400 (i.e. the side surface 110a of the right first trench 110) and the right side surface of the boundary structure 400 (i.e., the side surface 210a of the leftmost second trench 210) are asymmetrical, only the left side surface of the boundary structure 400 has the dielectric liner disposed thereon, and the right side surface of the boundary structure 400 does not have the dielectric liner 122 disposed thereon. The left side surface and the right side surface of the fin structure 220 (i.e., the left and right side surfaces 210a of the second trench 210) do not have the dielectric liner 122 disposed thereon and directly contact the second insulating layer 231 of the second isolation structure 230.

In subsequent applications, the first hard mask 310, the second hard mask 320, a portion of the first isolation structure 120 and a portion of the second isolation structure 230 can be removed by a planarization process, so that the top surface (not otherwise labeled) of the first isolation structure 120, the top surface (not otherwise labeled) of the second isolation structure 230, and the top surface (not otherwise labeled) of the boundary structure 400 are aligned with the top surface 10a of the substrate 10. In other words, compared to the isolation structure 1 of the semiconductor device shown in FIG. 5, the isolation structure of the semiconductor device according to another embodiment of the present disclosure may not include the first hard mask 310 and the second hard mask 320.

Compared with the prior art, in the method for fabricating an isolation structure of a semiconductor device according to the present disclosure, with forming a dielectric liner in a first trench after forming the first trench in a first region and before forming a second trench in a second region, the cross sectional shape of the boundary structure can be improved, which is beneficial to reduce the pollution caused by the break of the boundary structure, and reduce the probabilities of point discharge and noises during testing generated by the boundary structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An isolation structure of a semiconductor device, comprising:

a substrate having a first region and a second region, wherein there is a boundary between the first region and the second region;

a first isolation structure disposed in the first region of the substrate, wherein the first isolation structure comprises a dielectric liner and a first insulating layer; and a second isolation structure disposed in the second region of the substrate, wherein the second isolation structure comprises a second insulating layer, the first isolation structure and the second isolation structure are respectively located on both sides of the boundary, a boundary structure is defined between the first isolation structure and the second isolation structure, a width of the boundary structure is less than or equal to 50 nm, the boundary structure is not a fin structure, a first sidewall of the boundary structure directly contacts a side surface of the first isolation structure, a second sidewall of the boundary structure opposite to the first sidewall directly contacts a side surface of the second isolation structure, and the boundary structure has a triangular cross section formed by the first sidewall and the second sidewall.

2. The isolation structure of the semiconductor device of claim 1, wherein an inclined degree of the side surface of the first isolation structure relative to a top surface of the substrate is less than an inclined degree of the side surface of the second isolation structure relative to the top surface of the substrate.

3. The isolation structure of the semiconductor device of claim 1, wherein a material of the dielectric liner comprises an oxide or a nitride.

4. The isolation structure of the semiconductor device of claim 1, wherein a material of the dielectric liner is different from a material of the first insulating layer.

5. The isolation structure of the semiconductor device of claim 1, wherein a material of the first insulating layer is identical to a material of the second insulating layer.

6. The isolation structure of the semiconductor device of claim 5, wherein the material of the first insulating layer comprises an oxide.

7. The isolation structure of the semiconductor device of claim 1, wherein a height of the first isolation structure is greater than a height of the second isolation structure.

8. The isolation structure of the semiconductor device of claim 1, wherein a width of the first isolation structure is greater than a width of the second isolation structure.

9. The isolation structure of the semiconductor device of claim 1, wherein a distance between the first isolation structure and the second isolation structure is less than or equal to 50 nm.

10. The isolation structure of the semiconductor device of claim 1, wherein an operation voltage of the first region is greater than an operation voltage of the second region.

11. The isolation structure of the semiconductor device of claim 1, further comprising:

a fin structure disposed in the second region, and the second isolation structure surrounds the fin structure.

* * * * *